US005308997A

United States Patent [19]

Cooper et al.

[11] Patent Number: 5,308,997
[45] Date of Patent: May 3, 1994

[54] SELF-ALIGNED THIN FILM TRANSISTOR

[75] Inventors: Kent J. Cooper; Scott S. Roth; James D. Hayden; Howard C. Kirsch, all of Austin, Tex.

[73] Assignee: Motorola, Inc., Schaumburg, Ill.

[21] Appl. No.: 902,216

[22] Filed: Jun. 22, 1992

[51] Int. Cl.$^5$ .............. H01L 29/04; H01L 31/036; H01L 27/01
[52] U.S. Cl. .................... 257/57; 257/59; 257/66; 257/72; 257/347
[58] Field of Search .......... 257/57, 59, 66, 72, 257/329, 347, 340, 348, 350, 351, 352, 401, 302, 903

[56] References Cited

U.S. PATENT DOCUMENTS

| 4,554,572 | 11/1985 | Chatterjee | 357/42 |
| 4,845,537 | 7/1989 | Nishimura et al. | 357/23.4 |
| 4,914,628 | 4/1990 | Nishimura | 257/302 |
| 4,918,510 | 4/1990 | Pfiester | 357/42 |
| 4,984,030 | 1/1991 | Sunmami et al. | 257/302 |
| 5,096,845 | 3/1992 | Inoue | 437/40 |
| 5,115,289 | 5/1992 | Hisamoto et al. | 257/347 |
| 5,140,388 | 8/1992 | Bartelink | 257/401 |
| 5,225,701 | 7/1993 | Shimizu et al. | 257/347 |

FOREIGN PATENT DOCUMENTS

| 0295643A2 | 12/1988 | European Pat. Off. | 29/78 |
| 63-102355 | 5/1988 | Japan | 27/8 |

OTHER PUBLICATIONS

"Impact of Surrounding Gate Transistor (SGT) for Ultra-High-density LSI's," by H. Takato et al., IEEE Transactions on Electron Devices, vol. 38, No. 3, Mar. 1991, pp. 573-577.

Primary Examiner—Rolf Hille
Assistant Examiner—Steven Loke
Attorney, Agent, or Firm—Kent J. Cooper; James L. Clingan, Jr.

[57] ABSTRACT

A thin film transistor with self-aligned source and drain regions is fabricated, in one embodiment, by forming an opening (124) in a dielectric layer (118) which overlies a substrate (116). A semiconductive sidewall spacer (130) is formed around the perimeter (126) of the opening (124) and adjacent to the sidewall (128) of the opening (124). A first electrode region (120) is electrically coupled to a first portion of the semiconductive sidewall spacer (130) at a first location along the perimeter (126) of the opening (124) which lies only in the second lateral half of the opening (124). A second electrode region (122) is electrically coupled to a second portion of the semiconductive sidewall spacer (130) at a second location along the perimeter (126) of the opening (124) which lies only in the first lateral half of the opening (124). A dielectric layer (132) is formed adjacent to the semiconductive sidewall spacer (130). A control electrode (134) is formed adjacent to the dielectric layer (132).

23 Claims, 9 Drawing Sheets

SELF-ALIGNED THIN FILM TRANSISTOR

FIELD OF THE INVENTION

This invention relates generally to semiconductor devices, and more specifically to a thin film transistor and a process for the formation thereof.

BACKGROUND OF THE INVENTION

Thin film transistors (TFTs) are gaining acceptance in the semiconductor industry. In fact, TFT devices have already found application in both flat panel displays and in static memory devices. In the case of static memory devices, complementary metal oxide semiconductor (CMOS) and bipolar metal oxide semiconductor (BiCMOS) static random access memories (SRAMs) have in the past predominantly used polysilicon resistor load devices. The semiconductor industry's continual drive toward higher density SRAMs, however, makes the replacement of these traditional polysilicon resistor load devices with TFT devices very desirable. Both SRAMs and flat panel displays require well-behaved TFT devices that exhibit low leakage currents and high on/off current ratios. In addition, high density SRAMs require TFT devices that are compatible with small memory cell sizes.

The fabrication of reliable transistors with well-behaved electrical characteristics generally requires the source and drain regions of the transistor to be self-aligned to the gate. This allows the transistor channel length to be manufacturably fabricated because the source and drain regions are reproducibly self-aligned to the transistor channel region. The formation of TFT devices with self-aligned source and drain regions, however, has been difficult to achieve. Several different TFT devices such as, vertical, overgated, and undergated have been proposed in the past. Of these devices, however, only the over-gated TFT can be easily fabricated with self-aligned source and drain regions. Unfortunately, the utilization of over-gated TFTs in high density SRAMs is limited. Over-gated TFTs require an additional polysilicon gate electrode which must be electrically contacted to the control electrode of the latch transistor. The area required for laying out the polysilicon gate electrode, and the latch transistor contact, is substantial and thus limits the memory cell size that can be achieved with over-gated TFTs. Accordingly, a need exists for a TFT device, which is compatible with high device density requirements, and which has self-aligned source and drain regions.

SUMMARY OF THE INVENTION

The previously mentioned problems with existing TFT devices are overcome by the present invention. In one embodiment of the invention, a semiconductor device is formed having a semiconductive sidewall spacer which is used to form a channel region. The semiconductor device has a first electrode region which is electrically coupled to a first portion of the semiconductive sidewall spacer. The semiconductor device has a second electrode region which is electrically coupled to a second portion of the semiconductive sidewall spacer. The semiconductor device has a dielectric layer which is adjacent to the semiconductive sidewall spacer. The semiconductor device has a control electrode which is adjacent to the dielectric layer. The control electrode is electrically isolated from the first and the second electrode regions and from the semiconductive sidewall spacer.

These and other features, and advantages, will be more clearly understood from the following detailed description taken in conjunction with the accompanying drawings. It is important to point out that the illustrations may not necessarily be drawn to scale, and that there may be other embodiments of the present invention which are not specifically illustrated.

DETAILED DESCRIPTION OF A PREFERRED EMBODIMENT

Figure 1:
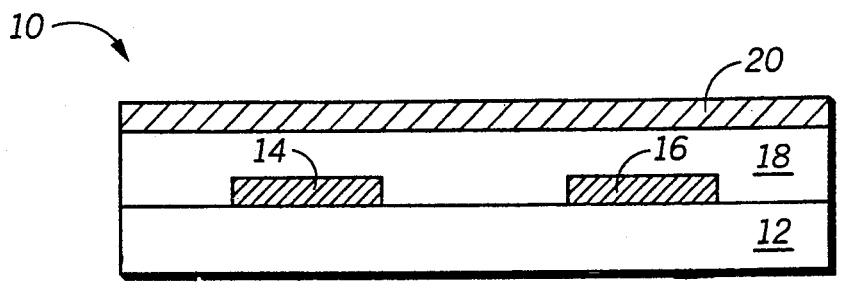
FIGS. 1-11 illustrate, in cross-section and top view, process steps in accordance with one embodiment of the invention.

FIGS. 1 through 11 illustrate, in cross-section and in top-view, process steps in accordance with one embodiment of the invention wherein a semiconductor device is formed. Shown in FIG. 1 is a portion 10 of an integrated circuit structure comprising a silicon substrate 12, a first electrode region 14, a second electrode region 16, a first dielectric layer 18, and a first conductive layer 20. In the preferred embodiment, first electrode region 14 and second electrode region 16 are the control or gate electrodes for two latch transistors in a six transistor SRAM memory cell. The latch transistors are formed using conventional processing techniques. First dielectric layer 18 is formed following the formation of first electrode region 14 and second electrode region 16. First dielectric layer 18 is preferably chemical vapor deposited silicon dioxide. First conductive layer 10 is formed following the formation of first dielectric layer 18. First conductive layer 20 is preferably p-type polysilicon which is formed using conventional deposition and doping techniques. In some applications first conductive layer 20 could also be n-type polysilicon. Alternatively, first conductive layer 20 may be a metal, a metal silicide, or a metal nitride layer.

Figure 2:
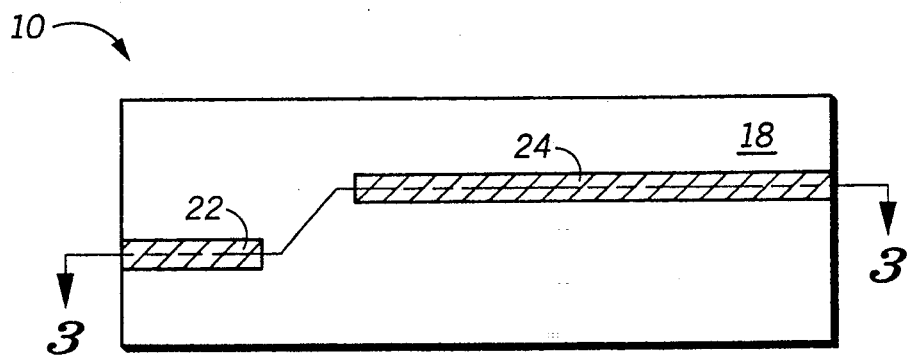
Figure 3:
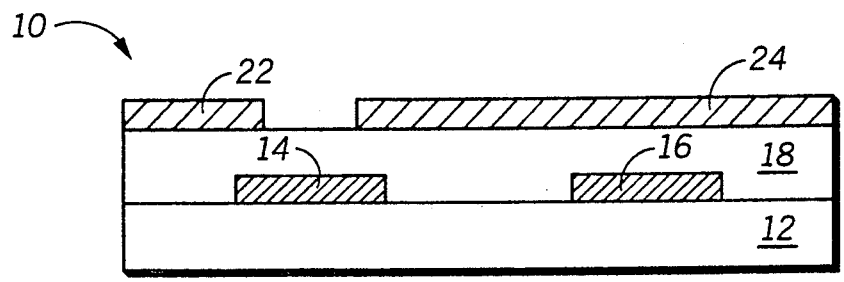
Figure 4:
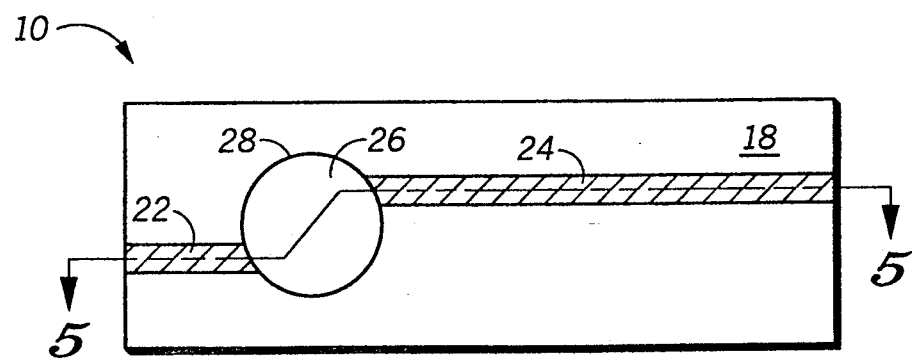

After first conductive layer 20 is formed, conventional photolithographic patterning and etching techniques are used to form a third electrode region 22 and a fourth electrode region 24. Third electrode region 22 and fourth electrode region 24 are electrically isolated from each other, and are preferably offset from one another, as shown in the top view given in FIG. 2. The alignment tolerance of subsequent photolithographic patterning steps is improved by offsetting the two electrode regions, as shown in FIG. 2. Third electrode region 22 and fourth electrode region 24 both lie within the same plane, as shown in FIG. 3. FIG. 3 is a cross-sectional view of FIG. 2 taken along the line 3—3.

Figure 5:
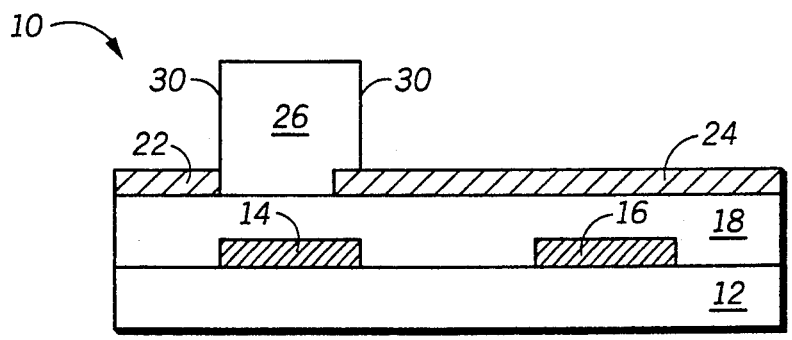
Figure 6:
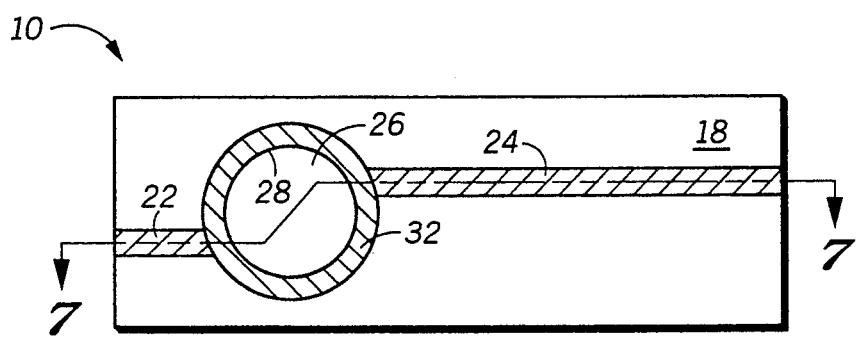

The process continues, in the preferred embodiment, with the formation of a second dielectric layer. The second dielectric layer is preferably chemical vapor deposited silicon dioxide. Using conventional photolithographic patterning and etching techniques, a portion of the second dielectric layer is patterned to form a second patterned dielectric layer 26 with a perimeter 28. The patterning process also exposes a portion of third electrode region 22 and a portion of fourth electrode region 24, as shown in the top view given in FIG. 4. Patterned dielectric layer 26, which has a relatively vertical sidewall 30, overlies both first dielectric layer 18, and first electrode region 14, as illustrated in FIG. 5. FIG. 5 is a cross-sectional view of FIG. 4 taken along line 5—5.

Figure 7:
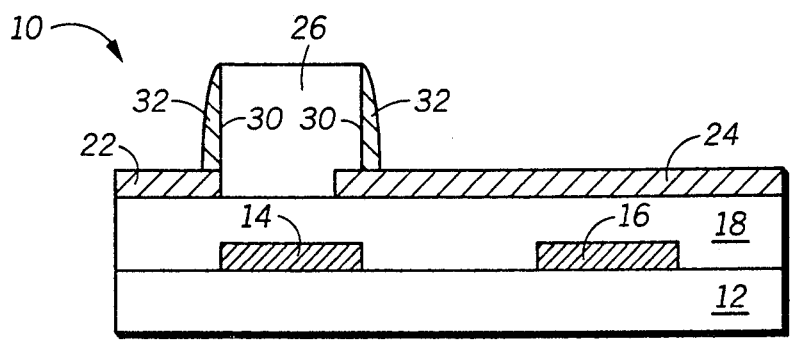

After second patterned dielectric 26 is formed, a relatively conformal layer of semiconductive material is deposited, which cover a portion of third electrode region 22, a portion of fourth electrode region 24, and sidewall 30. The layer of semiconductive material is preferably chemical vapor deposited polysilicon. Alternatively, the layer of semiconductive material may be amorphous silicon, germanium doped polysilicon, or monocrystalline silicon formed, for example, by recrystallization of amorphous silicon. The semiconductive layer is then anisotropically etched using conventional etching techniques to form a semiconductive sidewall spacer 32 around perimeter 28 of patterned dielectric layer 26, as shown in the top view given in FIG. 6. The semiconductive sidewall spacer 32 is formed adjacent to sidewall 30 and is in intimate contact with, and electrically coupled to, a portion of third electrode region 22 and to a portion of fourth electrode region 24, as shown in FIG. 7. FIG. 7 is a cross-sectional view of FIG. 6 taken along line 7—7.

Figure 8:
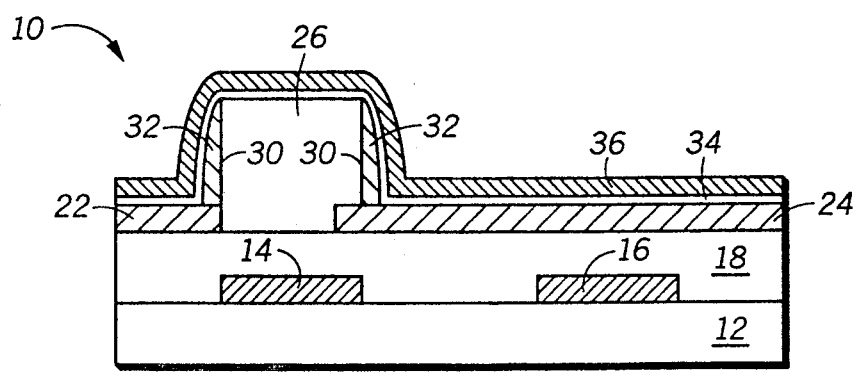

The process continues, in the preferred embodiment, with the formation of a third dielectric layer 34 adjacent to semiconductive sidewall spacer 32. Third dielectric layer 34 is preferably chemical vapor deposited silicon dioxide. Alternatively, third dielectric layer 34 may be an oxynitride layer, a thermally grown silicon dioxide layer, or a composite dielectric layer formed by the combination of any of the aforementioned dielectric materials. After third dielectric layer 34 is formed a second conductive layer 36 is deposited adjacent to third dielectric layer 34, as shown in FIG. 8. Second conductive layer 36 is preferably chemical vapor deposited polysilicon. Alternatively, second conductive layer 36 may be a metal, a metal silicide, or a metal nitride layer. FIG. 8 is a cross-sectional view of FIG. 7 taken after the formation of third dielectric layer 34 and second conductive layer 36.

Figure 9:
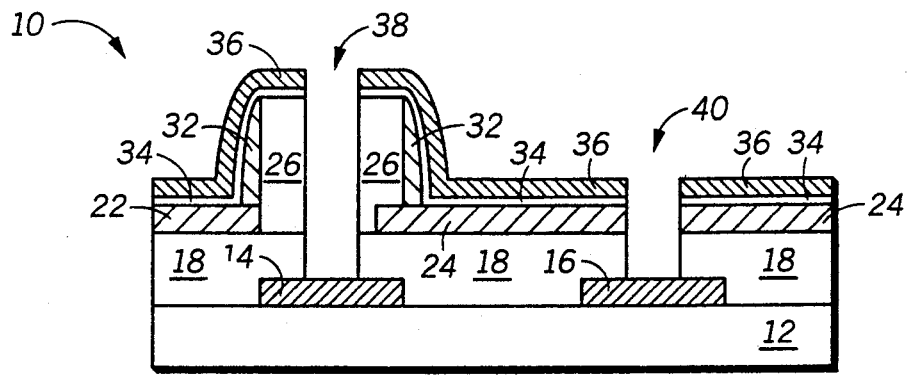
Figure 10:
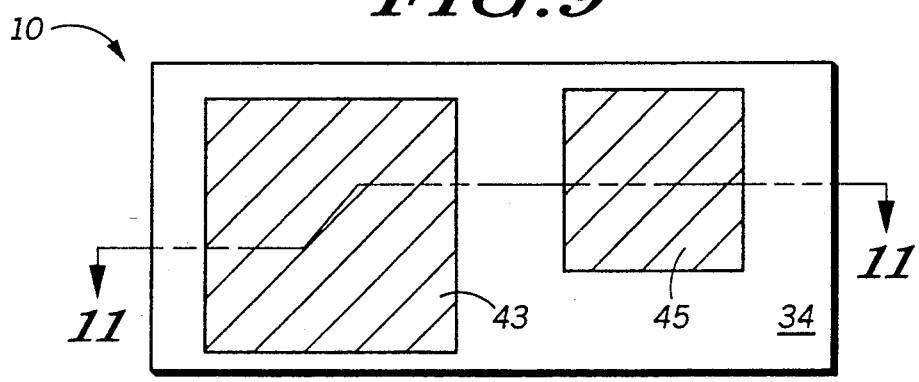

Following the deposition of second conductive layer 36, conventional photolithographic patterning and etching techniques are used to form a first contact opening 38. Contact opening 38 extends through a first portion of second conductive layer 36, a first portion of third dielectric layer 34, a portion of patterned dielectric layer 26, and a first portion of first dielectric layer 18, and intersects with a portion of first electrode region 14, as shown in FIG. 9. Additionally, a second optional contact opening 40 may also be formed simultaneously with first contact opening 38. Second contact opening 40 extends through a second portion of conductive layer 36, a second portion of third dielectric layer 34, a second portion of first dielectric layer 18, and intersects with a portion of fourth electrode region 24 and a portion of second electrode region 16, as shown in FIG. 9. FIG. 9 is a cross-sectional view of FIG. 8 taken after contact opening 38 and contact opening 40 are formed. Additionally, if only contact opening 38 is formed, then a dielectric sidewall spacer may be formed adjacent to the sidewall of opening 38 in order to insure that third electrode 22 and fourth electrode 24 are electrically isolated from opening 38.

Figure 11:
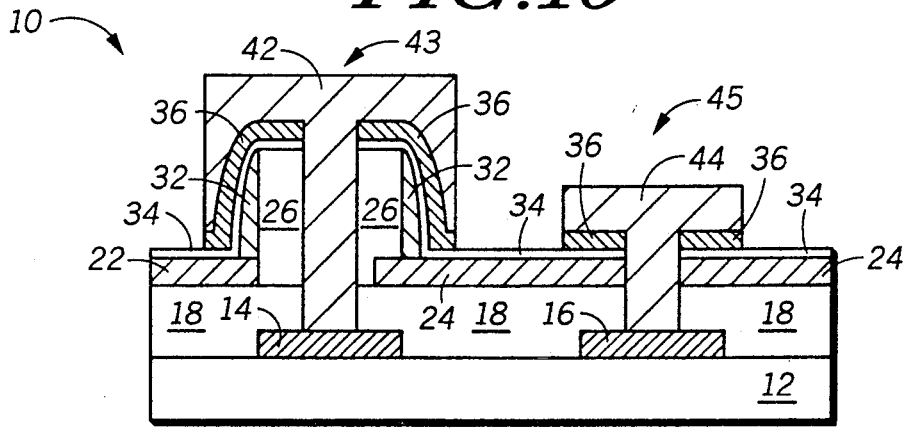

The process continues with the formation of a third conductive layer which is in intimate contact with, and electrically coupled to, second conductive layer 36 and a portion of first electrode region 14. If contact opening 40 is also formed, as previously discussed, then the third conductive layer is also in intimate contact with, and electrically coupled to, a portion of second electrode region 16 and a portion of fourth electrode region 24. The third conductive layer is preferably chemical vapor deposited polysilicon. Alternatively, the third conductive layer is a metal, a metal silicide, or a metal nitride layer. Using conventional photolithographic patterning and etching techniques a first portion 42 of the third conductive layer and a third portion of second conductive layer 36 are patterned to form a control electrode 43, as shown in the top view given in FIG. 10. Control electrode 43 is adjacent to third dielectric layer 34 and is electrically coupled to first electrode region 14, as shown in FIG. 11. Control electrode 43 is also electrically isolated from semiconductive sidewall spacer 32, third electrode region 22, and fourth electrode region 24. Additionally, if second contact opening 40 is formed, as previously discussed, a second portion 44 of the third conductive layer and fourth portion of third conductive layer 36 is patterned to form a patterned conductive region 45, as shown in the top view given in FIG. 10. Second electrode region 16 and fourth electrode region 24 are electrically coupled by patterned conductive region 45, as shown in FIG. 11. FIG. 11 is a cross-sectional view of FIG. 10 taken along the line 11—11.

Alternatively, for flat panel display applications, device fabrication could begin with the formation of conductive layer 20 on a substrate suitable for the fabrication of flat panel displays, such as glass or quartz. In this alternative embodiment device fabrication would be the same as that discussed in FIG. 2 through FIG. 8 with the exception that first electrode region 14 and second electrode region 16 would not be present, and first dielectric region 18 and substrate 12 would be replaced with a glass or quartz substrate. Following the deposition of conductive layer 36, conductive layer 36 would be patterned using conventional photolithographic patterning and etching techniques to form a control electrode. In this alternative embodiment, conductive layer 36 may be deposited with a thickness which is greater than that used for the embodiment illustrated in FIG. 1-FIG. 11.

Figure 12:
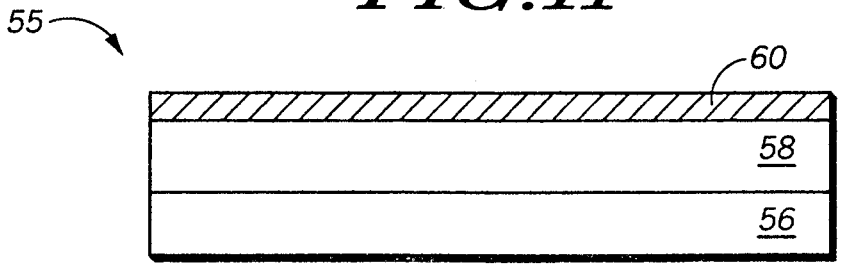
FIGS. 12-20 illustrate, in cross-section and in top view, process steps in accordance with a second embodiment of the invention.

Shown in FIG. 12 is a portion 55 of an integrated circuit structure comprising a silicon substrate 56, a first dielectric layer 58, and a first conductive layer 60. First dielectric layer 58 is preferably chemical vapor deposited silicon dioxide. Alternatively, substrate 56 may be thermally oxidized to form first dielectric layer 58. First conductive layer 60 is preferably p-type polysilicon which is formed using conventional deposition and doping techniques. In some applications first conductive layer 60 could also be n-type polysilicon. Alternatively first conductive layer 60 may be a metal, a metal silicide, or a metal nitride layer.

Figure 13:
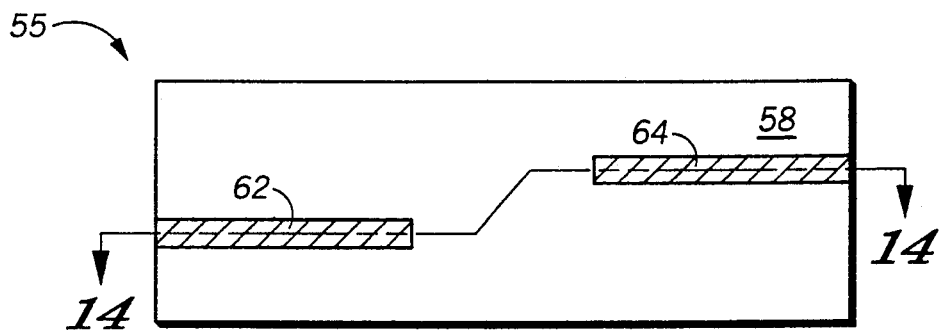
Figure 14:
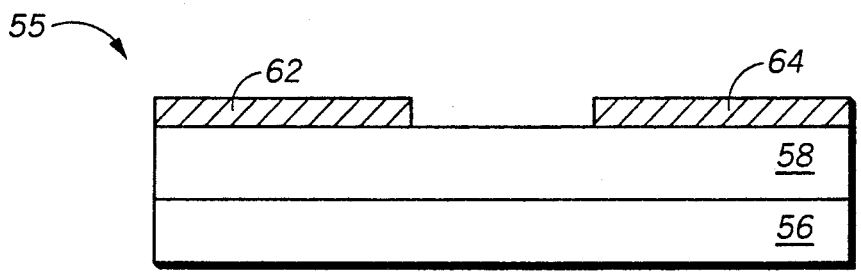

After first conductive layer 60 is deposited, conventional photolithographic patterning and etching techniques are used to form a first electrode region 62 and a second electrode region 64. First electrode region 62 and second electrode region 64 are electrically isolated from each other, and are preferably offset from one another, as shown in the top view given in FIG. 13. Once again, the alignment tolerance of subsequent photolithographic patterning steps is improved by offsetting the two electrode regions, as shown in FIG. 13. First electrode region 62 and second electrode region 64 both lie within the same plane, as shown in FIG. 14. FIG. 14 is a cross-sectional view of FIG. 13 taken along the line 14—14.

Figure 15:
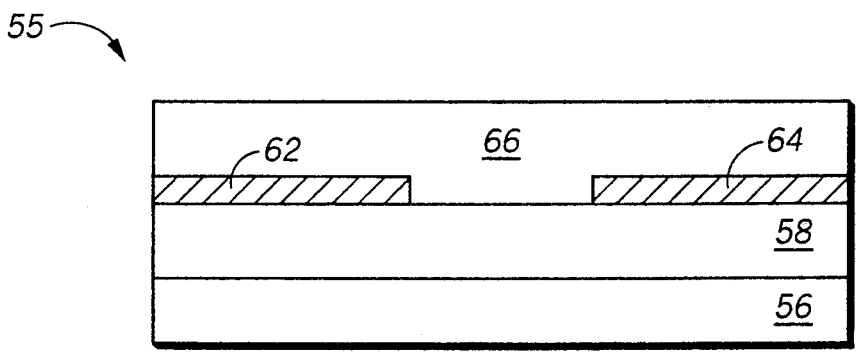

Referring to FIG 15, the process continues with the deposition of a second dielectric layer 66 which overlies first electrode region 62 and second electrode region 64. Second dielectric layer 66 is preferably chemical vapor deposited silicon dioxide. FIG. 15 is a cross-section of FIG. 14 taken after the formation of second dielectric layer 66.

Figure 16:
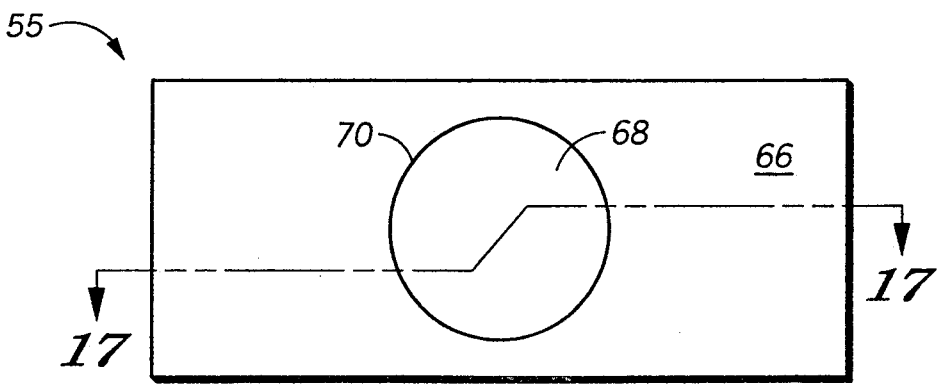
Figure 17:
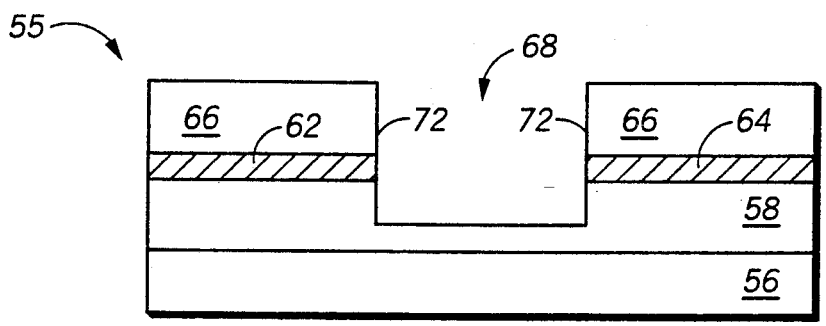

Using conventional photolithographic patterning and etching techniques, the process continues with the formation of an opening 68 in second dielectric layer 66. The perimeter 70 of opening 68 is shown in the top view given in FIG. 16. Opening 68 has a relatively vertical sidewall 72 which intersects a portion of first electrode region 62 and a portion of second electrode region 64, as shown in FIG. 17. FIG. 17 is a cross-sectional view of FIG. 16 taken along the line 17—17. In FIG. 17, opening 68 is shown to extend into a portion of first dielectric layer 58, however, opening 68 need not extend into first dielectric layer 58. Conversely, opening 68 may extend through dielectric layer 58 and the bottom surface of opening 68 may be coincident with substrate 56.

Figure 18:
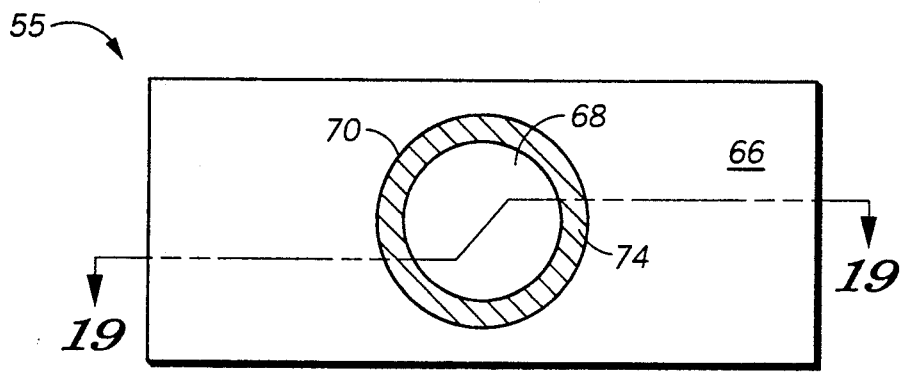
Figure 19:
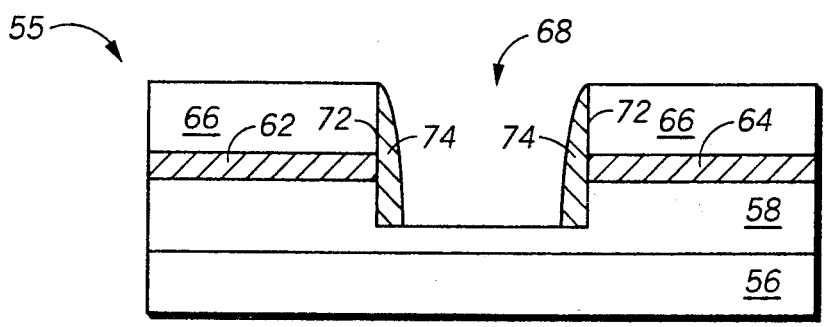

Following the formation of opening 68, a relatively conformal semiconductive layer is deposited covering sidewall 72. The layer of semiconductive material is preferably chemical vapor deposited polysilicon. Alternatively, the layer of semiconductive material could be amorphous silicon, germanium doped polysilicon, or monocrystalline silicon formed, for example, by recrystallization of amorphous silicon. The semiconductive layer is then anisotropically etched using conventional etching techniques to form a semiconductive sidewall spacer 74 around perimeter 70 of opening 68, as shown in the top view given in FIG. 18. Semiconductive sidewall spacer 74 is adjacent to sidewall 72 and is in intimate contact with, and electrically coupled to, a portion of first electrode region 62 and a portion of second electrode region 64, as shown in FIG. 19. FIG. 19 is a cross-sectional view of FIG. 18 taken along the line 19—19. Additionally, if opening 68 extends through first dielectric layer 58, as previously discussed, then a portion of substrate 56, underlying semiconductive sidewall spacer 74, may also be used to electrically contact semiconductive sidewall spacer 74 to form a body contact to the channel region of the TFT device. Furthermore, a portion of first electrode region 62 and a portion of second electrode region 64 may be isotropically etched using conventional etching techniques prior to the deposition of the semiconductive layer. The isotropic etch allows first electrode region 62 and second electrode region 64 to be offset form the TFT channel region.

Figure 20:
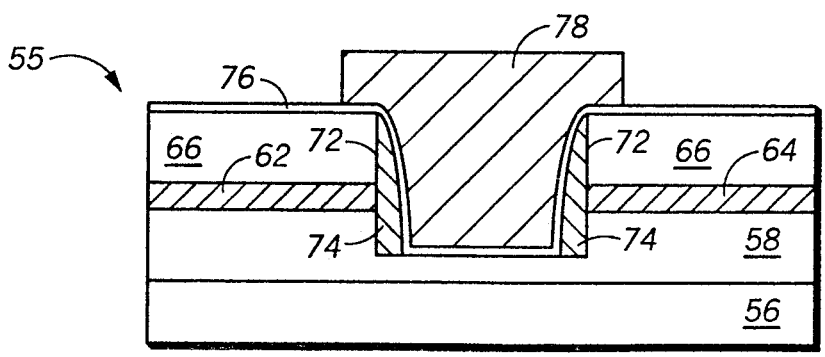

Referring to FIG. 20, the process continues with the formation of a third dielectric layer 76 adjacent to semiconductive sidewall spacer 74. Third dielectric layer 76 is preferably chemical vapor deposited silicon dioxide. Alternatively, third dielectric layer 76 may be an oxynitride layer, a thermally grown silicon dioxide layer, or a composite dielectric layer formed by the combination of any of the aforementioned dielectric layers. Following the formation of third dielectric layer 76, a second conductive layer is deposited adjacent to third dielectric layer 76. The second conductive layer is preferably chemical vapor deposited polysilicon. Alternatively, the second conductive layer could be a metal, a metal silicide, or a metal nitride layer. Using conventional photolithographic patterning and etching techniques the second conductive layer is pattered to form a control electrode 78, which is electrically isolated from semiconductive sidewall spacer 74, first electrode region 62, and second electrode region 64, as shown in FIG. 20. FIG. 20 is a cross-sectional view of FIG. 19 taken after the formation of third dielectric layer 76 and control electrode 78.

Alternatively, for flat panel display applications, device fabrication could begin with the deposition of conductive layer 60 onto a substrate suitable for the fabrication of flat panel displays, such as glass or quartz. In this alternative embodiment, device fabrication would be the same as that discussed in FIG. 13 through FIG. 20, with the exception that first dielectric region 58 and substrate 56 would be replaced with a glass or quartz substrate.

Figure 21:
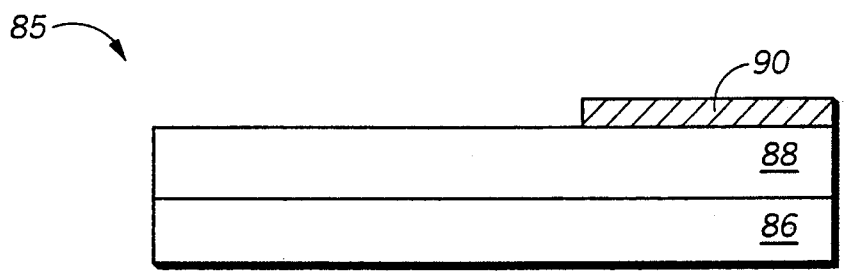
FIGS. 21-30 illustrate, in cross-section and in top view, process steps in accordance with a third, embodiment of the invention.

Shown in FIG. 21 is a portion 85 of an integrated circuit structure comprising a silicon substrate 86, a first dielectric layer 88 analogous to first dielectric layer 58 in FIG. 12, and a first electrode region 90 analogous to second electrode region 64 in FIG. 13 and FIG. 14. First dielectric layer 88 and first electrode region 90 are formed using the same steps discussed in FIG. 12 through FIG. 14 with the exception that only one electrode region is formed instead of two, as shown in FIG. 13 and FIG. 14.

Figure 22:
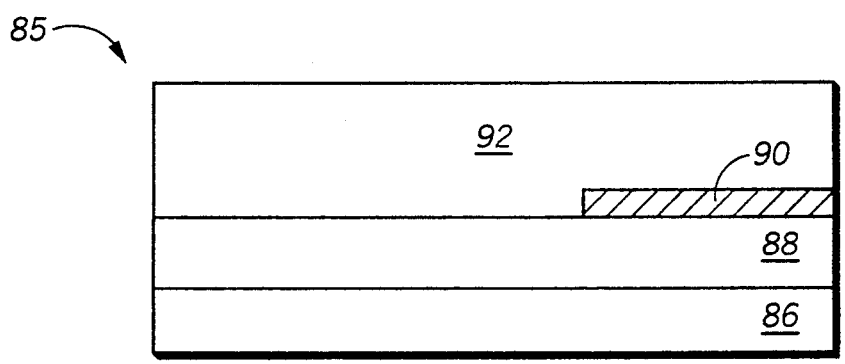

Following the formation of first electrode region 90, a second dielectric layer 92 is formed overlying first electrode region 90, as shown in FIG. 22. Second dielectric layer 92 is preferably chemical vapor deposited silicon dioxide.

Figure 23:
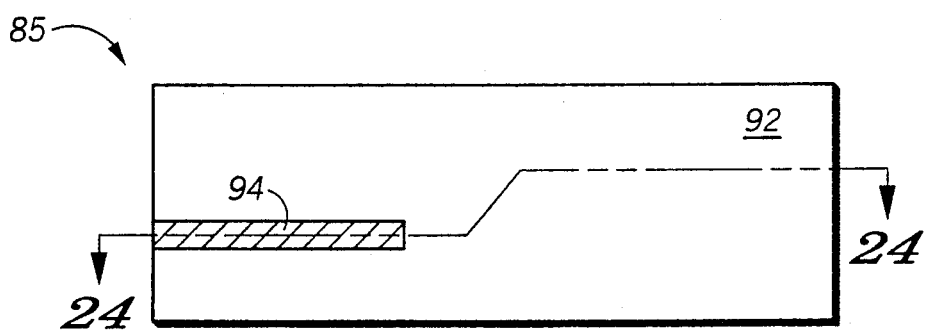
Figure 24:
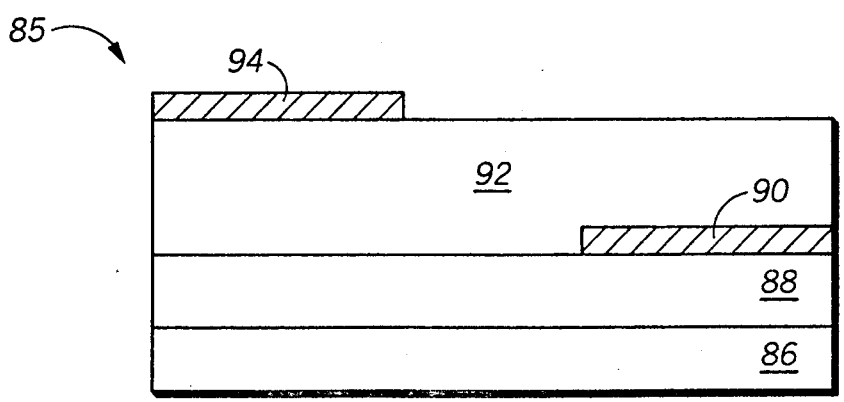

Referring to FIG. 23, the process continues with the deposition of a second conductive layer. The second conductive layer is preferably p-type polysilicon which is formed using conventional deposition and doping techniques. In some applications the second conductive layer could also be n-type polysilicon. Alternatively, the second conductive layer may be a metal, a metal silicide, or a metal nitride layer. Using conventional photolithographic patterning and etching techniques, the second conductive layer is patterned to form a second electrode region 94, as shown in the top view given in FIG. 23. First electrode region 90 is electrically isolated from second electrode region 94, as shown in FIG. 24 is a cross-sectional view of FIG. 23 taken along the line 24—24.

Figure 25:
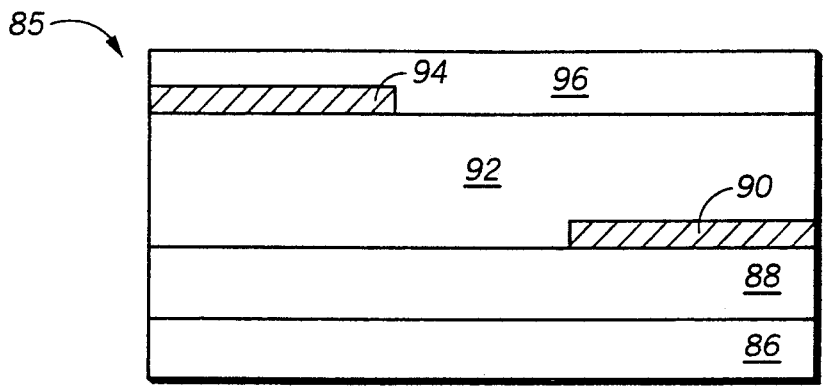

Following the formation of second electrode region 94, an optional third dielectric layer 96 many be deposited overlying second electrode region 94, as shown in FIG. 25. Third dielectric layer 96 is preferably chemical vapor deposited silicon dioxide. FIG. 25 is a cross-sectional view of FIG. 24 taken after the formation of third dielectric layer 96.

Figure 26:
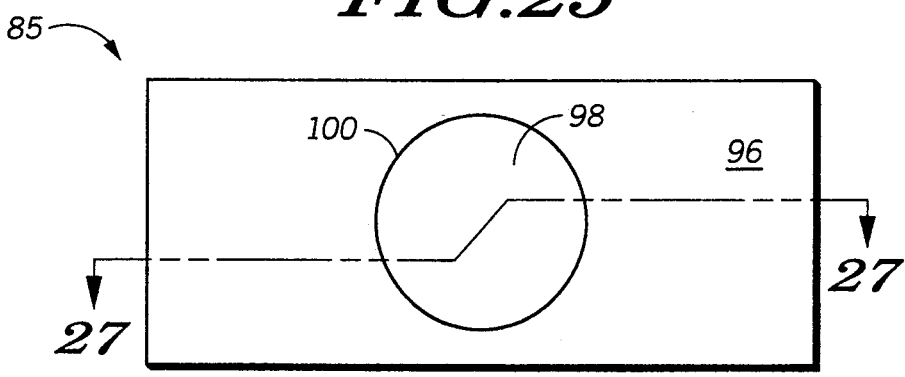
Figure 27:
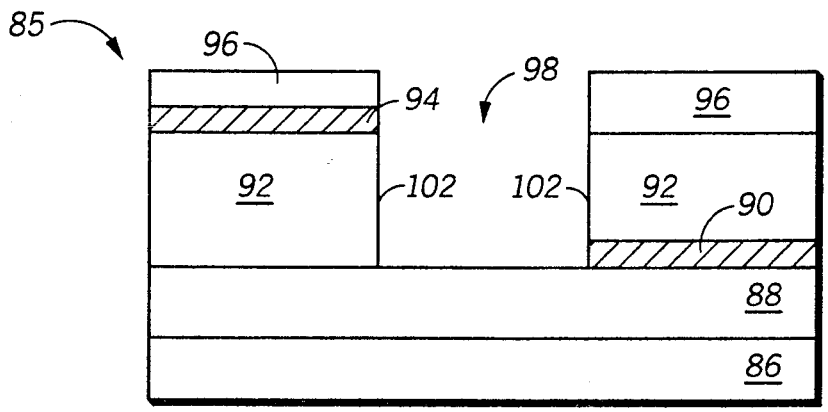

Using conventional photolithographic patterning and etching techniques, the process continues with the formation of an opening 98 which extends through third dielectric layer 96 and into second dielectric layer 92. The perimeter 100 of opening 98 is shown in the top view given in FIG. 26. Opening 98 has a relatively vertical sidewall 102 which intersects a portion of first electrode region 90 and a portion of second electrode region 94, as shown in FIG. 27. FIG. 27 is a cross-sectional view of FIG. 26 taken along the line 27—27. In FIG. 27, opening 98 is shown not to extend into a portion of first dielectric layer 88, however, opening 98 may extend into first dielectric layer 88. Additionally, opening 98 may extend through first dielectric layer 88 and the bottom surface of opening 98 may be coincident with substrate 86.

Figure 28:
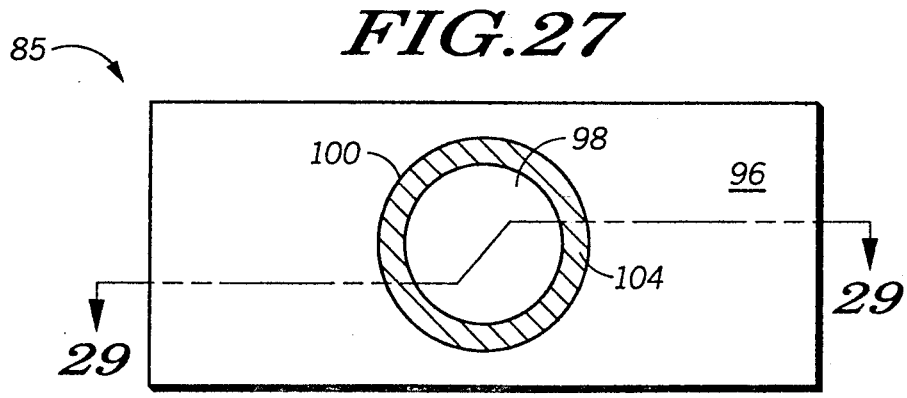
Figure 29:
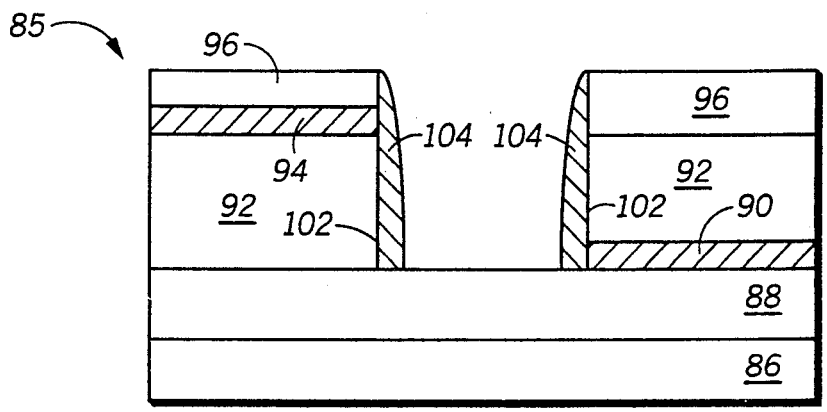

Following the formation of opening 98, a relatively conformal semiconductive layer is deposited covering sidewall 102. The layer of semiconductive material is preferably chemical vapor deposited polysilicon. Alternatively, the layer of semiconductive material could be amorphous silicon, germanium doped polysilicon, or monocrystalline silicon formed, for example, by recrystallization of amorphous silicon. The semiconductive layer is then anisotropically etched using conventional etching techniques to form a semiconductive sidewall spacer 104 around perimeter 100 of opening 98, as shown in the top view given in FIG. 28. Semiconductive sidewall spacer 104 is adjacent to sidewall 102 and is in intimate contact with, and electrically coupled to, a portion of first electrode region 90 and a portion of second electrode region 94, as shown in FIG. 29. FIG. 29 is a cross-sectional view of FIG. 28 taken along the line 29—29. Additionally, if opening 98 extends through first dielectric layer 88, as previously discussed, then a portion of substrate 86, underlying semiconductive sidewall spacer 104, may also be used to electrically contact semiconductive sidewall spacer 104 to form a body contact to the channel region of the TFT device. Furthermore, a portion of first electrode region 90 and a portion of second electrode region 94 may be isotropically etched using conventional etching techniques prior to the deposition of the semiconductive layer. The isotropic etch allows first electrode region 90 and second electrode region 94 to be offset from the TFT channel region. Alternatively, just first electrode region 90 may be isotropically etched to form the offset.

Figure 30:
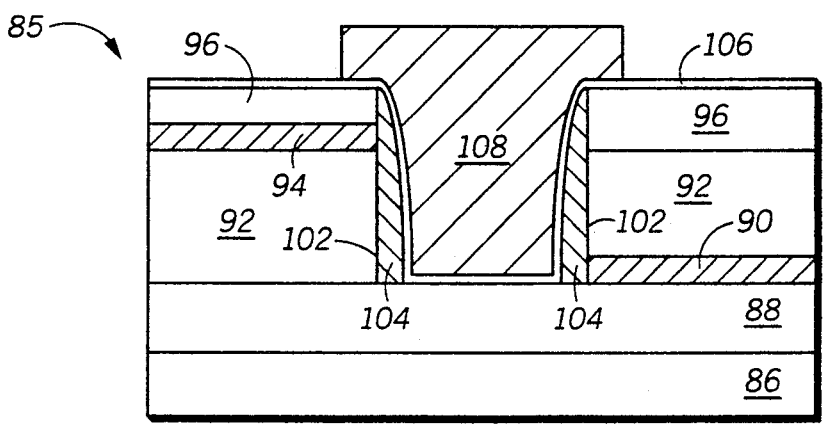

Referring to FIG. 30, the process continues with the formation of a fourth dielectric layer 106 adjacent to semiconductive sidewall spacer 104. Fourth dielectric layer 106 is preferably chemical vapor deposited silicon dioxide. Alternatively, third dielectric layer 106 may be an oxynitride layer, a thermally grown silicon dioxide layer, or a composite dielectric layer formed by the combination of any of the aforementioned dielectric layers. Following the formation of fourth dielectric layer 106, a third conductive layer is deposited adjacent to fourth dielectric layer 106. The third conductive layer is preferably chemical vapor deposited polysilicon. Alternatively, the third conductive layer may be a metal, a metal silicide, or a metal nitride layer. Using conventional photolithographic patterning and etching techniques the third conductive layer is patterned to form a control electrode 108, which is electrically isolated from semiconductive sidewall spacer 104, first electrode region 90, and second electrode region 94, as shown in FIG. 30. FIG. 30 is a cross-sectional view of FIG. 29 taken after the formation of fourth dielectric layer 106 and control electrode 108.

Alternatively, for flat panel display applications, device fabrication may begin with the formation of first conductive region 90 on a substrate suitable for the fabrication of flat panel displays, such as glass or quartz. In this alternative embodiment, device fabrication would be the same as that discussed in FIG. 21 through FIG. 30, with the exception that first dielectric region 88, and substrate 86 would be replaced with a glass or quartz substrate.

Figure 31:
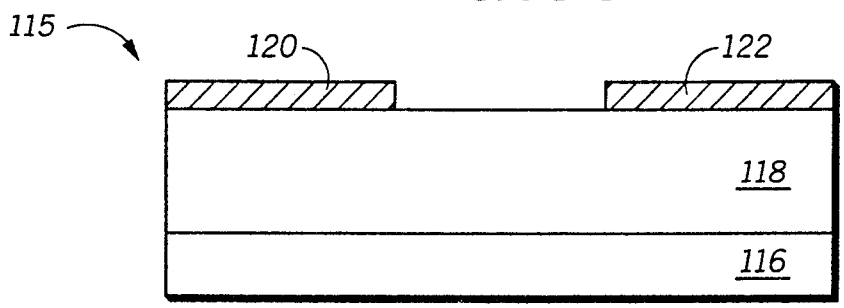
FIGS. 31-36 illustrate, in cross-section and in top view, process steps in accordance with a fourth embodiment of the invention.

Shown in FIG. 31 is a portion 115 of an integrated circuit structure comprising a silicon substrate 116, a first dielectric layer 118 analogous to first dielectric layer 58 shown in FIG. 14, a first electrode region 120 analogous to first electrode region 62 in FIG. 14, and a second electrode region 122 analogous to second electrode region 64 shown in FIG. 14. First dielectric layer 118 is shown to have a thickness which is greater than first dielectric layer 58, however, in this alternative embodiment first dielectric layer 118 need not be thicker than first dielectric layer 58. First dielectric layer 118, first electrode region 120, and second electrode region 122 are formed using the same steps discussed in FIG. 12 through FIG. 14.

Figure 32:
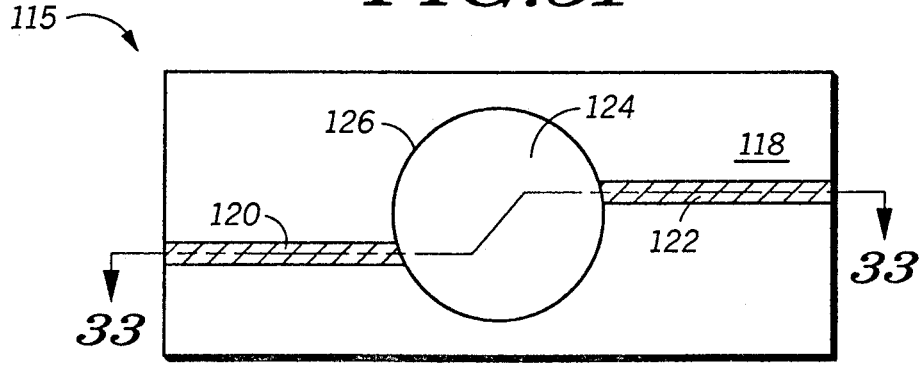
Figure 33:
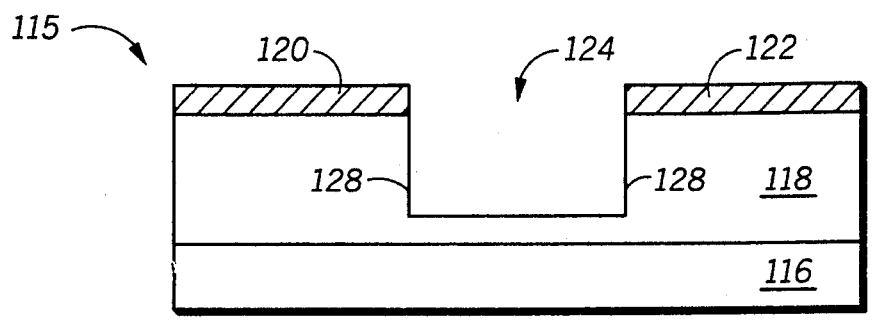

Using conventional photolithographic patterning and etching techniques, the process continues with the formation of an opening 124 in firs dielectric layer 118. The perimeter 126 of opening 124 is shown in the top view given in FIG. 32. Opening 124 has a relatively vertical sidewall 128 which intersects a portion of first electrode region 120 and a portion of second electrode region 122, as shown in FIG. 33. FIG. 33 is a cross-sectional view of FIG. 32 taken along the line 33—33. In FIG. 33, opening 124 is shown not to extend through first dielectric layer 118, however, opening 124 may extend through dielectric layer 118 and the bottom surface of opening 124 may be coincident with substrate 116.

Figure 34:
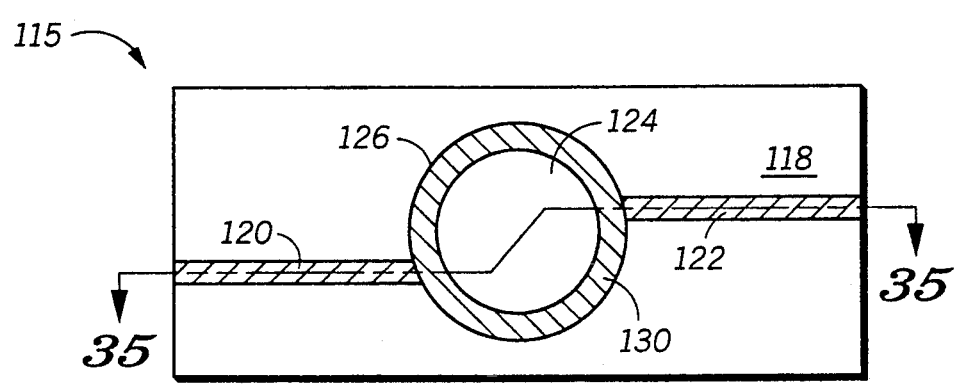
Figure 35:
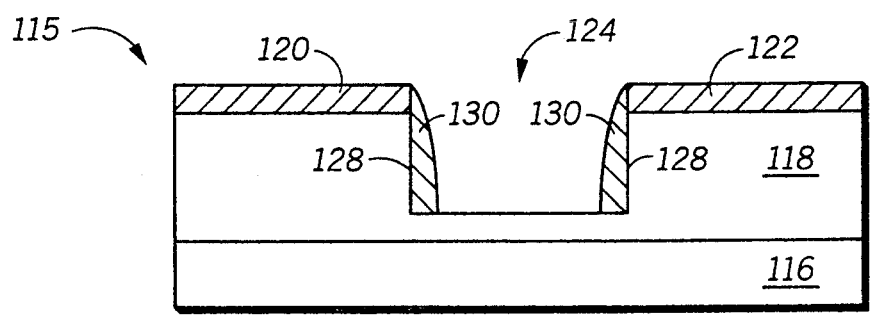

Following the formation of opening 124, a relatively conformal semiconductive layer is deposited covering sidewall 128. The layer of semiconductive material is preferably chemical vapor deposited polysilicon. Alternatively, the layer of semiconductive material could be amorphous silicon, germanium doped polysilicon, or monocrystalline silicon formed, for example, by recrystallization of amorphous silicon. The semiconductive layer is then anisotropically etched using conventional etching techniques to form a semiconductive sidewall spacer 130 around perimeter 126 of opening 124, as shown in the top view given in FIG. 34. Semiconductive sidewall spacer 130 is adjacent to sidewall 128 and is in intimate contact with, and electrically coupled to, a portion of first electrode region 120 and a portion of second electrode region 122, as shown in FIG. 35. FIG. 35 is a cross-sectional view of FIG. 34 taken along the line 35—35. Additionally, if opening 124 extends through first dielectric layer 118, as previously discussed, then a portion of substrate 116, underlying semiconductive sidewall spacer 130, may also be used to electrically contact semiconductive sidewall spacer 130 to form a body contact to the channel region of the TFT device.

Figure 36:
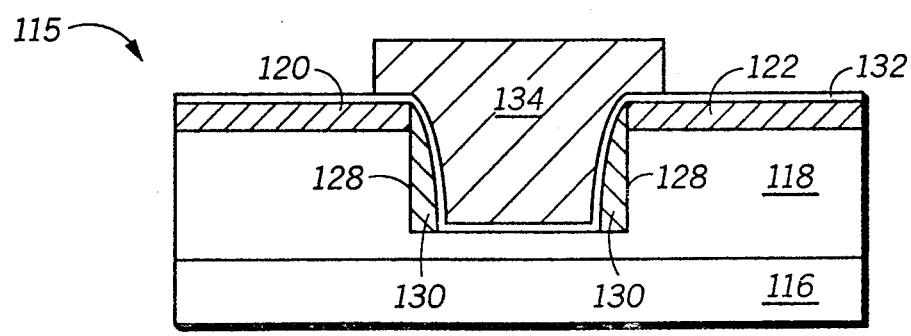

Referring to FIG. 36, the process continues with the formation of a third dielectric layer 132 adjacent to semiconductive sidewall spacer 130 and overlying first electrode region 120 and second electrode region 122. Third dielectric layer 132 is preferably chemical vapor deposited silicon dioxide. Alternatively, third dielectric layer 132 may be an oxynitride layer, a thermally grown silicon dioxide layer, or a composite dielectric layer formed by the combination of any of the aforementioned dielectric layers. Following the formation of third dielectric layer 132, a second conductive layer is deposited adjacent to third dielectric layer 132. The second conductive layer is preferably chemical vapor deposited polysilicon. Alternatively, the second conductive layer may be a metal, a metal silicide, or a metal nitride layer. Using conventional photolithographic patterning and etching techniques the second conductive layer is patterned to form a control electrode 134, which is electrically isolated from semiconductive sidewall spacer 130, first electrode region 120, and second electrode region 122, as shown in FIG. 36. FIG. 36 is a cross-sectional view of FIG. 35 taken after the formation of third dielectric layer 132 and control electrode 134.

The foregoing description and illustrations contained herein demonstrate many of the advantages associated with the present invention. One advantage is that the source and drain regions of the TFT device are self-aligned to the TFT channel region. This is clearly shown in FIG. 34, wherein first electrode region 120 is self-aligned to, and electrically coupled with, a first portion of annular semiconductive sidewall spacer 130 at a location along perimeter 126 which lies only within the first lateral half of the opening. Similarly, second electrode region 122 is also shown to be self-aligned to, and electrically coupled with, a second portion of semiconductor sidewall spacer 130 at a location along perimeter 126 which lies only within the second lateral half of the opening. Therefore, TFT devices with well-behaved electrical characteristics can be achieved with this process. Another advantage is that the TFT devices can be stacked directly on top of underlying latch transistors, as in a six transistor memory cell. Therefore, small memory cell sizes suitable for high density SRAMs can be achieved because cell area can be minimized. Furthermore, the gate electrode of the TFT device can also be directly coupled to the underlying gate electrode of the first latch transistor. Therefore, the gate electrode of the TFT device and the gate electrode of the latch transistor can be, for example, of continuous polysilicon. Additionally, the drain of the TFT device can simultaneously be electrically coupled to the underlying gate electrode of the second latch transistor, as shown in FIG. 11. Therefore, memory cell area can be further reduced because the area occupied by contacts is also minimized. In addition, simultaneous formation of these contacts also simplifies the SRAM fabrication process, because additional contact patterning and etching steps are eliminated. Another advantage is that the channel region of the TFT device can also be easily contacted with another electrode region to form a body contact. Therefore, the TFT "kink" effect can be addressed in applications where the effect may be undesirable.

Thus it is apparent that there has been provided, in accordance with the invention, a semiconductor device and method for the formation thereof that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing form the spirit of the invention. For example, patterned dielectric layer 26 in FIG. 4 and opening 68 in FIG. 16 are shown to be circular. These features, however, could also have another geometric shape such as a polygon, or an ellipse, etcetera. It is envisioned that an annular semiconductive sidewall spacer could be formed around any feature which has a contour that allows sidewall spacers to be formed. Additionally, TFT polysilicon electrode regions were doped prior to etching. TFT polysilicon electrode regions, however, could have been doped after TFT electrode patterning, or after control electrode formation, or after the formation of an offset spacer adjacent to the control electrode, etcetera. Furthermore, it is envisioned that the control electrodes in the second, third, and fourth embodiments could also be coupled to the gate electrode of an underlying transistor, in a manner similar to the first embodiment. Additionally, it is envisioned that a body contact could also be formed to the channel region of the device described in FIG. 1–FIG. 11. It is also envisioned that a non-volatile memory cell could also be fabricated having a structure similar to that shown in FIG. 11. Furthermore, it is also envisioned that the electrode regions contacting the semiconductive sidewall spacer could be used to dope a portion of the semiconductive sidewall spacer. Additionally, this invention is not limited to those materials specifically described. Although preferred materials have been recited, it is envisioned that numerous materials are suitable for each of the elements of the present invention. Therefore, it is intended that this invention encompass all such variations and modifications as fall within the scope of the appended claims.

We claim:

1. A semiconductor device comprising:
    a substrate;
    a feature overlying the substrate wherein the feature is divided into a first lateral half and a second lateral half, the feature having a perimeter and a sidewall;
    a semiconductive sidewall spacer adjacent to the sidewall of the feature wherein the semiconductive sidewall spacer is formed around the perimeter of the feature, the semiconductive sidewall spacer having a channel region formed therein;
    a first electrode region electrically coupled to a first portion of the semiconductive sidewall spacer at a first location along the perimeter which lies only within the second lateral half of the feature wherein the first electrode region is self-aligned to the channel region;
    a second electrode region electrically coupled to a second portion of the semiconductive sidewall spacer at a second location along the perimeter which lies only within the first lateral half of the feature wherein the second electrode region is self-aligned to the channel region;
    a dielectric layer adjacent to the semiconductive sidewall spacer;
    a control electrode adjacent the dielectric layer wherein the control electrode is electrically isolated from the first and the second electrode regions and the semiconductive sidewall spacer.

2. The device of claim 1, where in the semiconductive sidewall spacer comprises a material selected from the group consisting of polysilicon, amorphous silicon and monocrystalline silicon.

3. A semiconductor device comprising:
    a substrate;
    a first electrode region overlying the substrate, the first electrode region lying within a first plane;
    a second electrode region overlying the substrate and electrically isolated from the first electrode region, the second electrode region lying within the first plane;
    a first patterned dielectric layer overlying the substrate and extending above the first and second electrode regions, the first patterned dielectric layer having a perimeter and a sidewall;

a semiconductive sidewall spacer adjacent to the sidewall of the first patterned dielectric layer, and formed around the perimeter of the first patterned dielectric layer, the semiconductive sidewall spacer being electrically coupled to the first and the second electrode regions;

a second dielectric layer adjacent to the semiconductive sidewall spacer;

a control electrode adjacent the second dielectric layer wherein the control electrode is electrically isolated from the first and the second electrode regions and the semiconductive sidewall spacer.

4. The device of claim 3, wherein the semiconductive sidewall space comprises a material selected from the group consisting of polysilicon, amorphous silicon and monocrystalline silicon.

5. The device of claim 3 further comprising:
a third dielectric layer overlying the substrate and underlying the first electrode region, the second electrode region, and the first patterned dielectric layer.

6. The device of claim 5 further comprising:
a third electrode region underlying the first patterned dielectric layer and the third dielectric layer; and
a first opening extending through the first patterned dielectric layer and the third dielectric layer wherein the control electrode is electrically coupled to the third electrode region through the first opening.

7. The device of claim 6 further comprising:
a fourth electrode region underlying the second electrode region and the third dielectric layer; and
a second opening extending through the third dielectric layer; and
a patterned conductive region electrically coupling the second electrode region and the underlying fourth electrode region through the second opening.

8. A semiconductor device comprising:
a substrate;
a first electrode region overlying the substrate;
a first dielectric layer overlying the first electrode region;
a second electrode region overlying the substrate;
an opening in the first dielectric layer wherein the opening is divided into a first lateral half and a second lateral half wherein a portion of the first electrode region is intersected in only the second lateral half of the opening, and a portion of the second electrode region is intersected in only the first lateral half of the opening, the opening having a perimeter and a sidewall;
a semiconductive sidewall spacer adjacent to the sidewall of the opening, and formed around the perimeter of the opening, the semiconductive sidewall spacer being electrically coupled to the first electrode region in only the second lateral half of the opening, and the semiconductive sidewall spacer being electrically coupled to the second electrode region in only the first lateral half of the opening;
a second dielectric layer adjacent to the semiconductive sidewall spacer;
a control electrode adjacent to the second dielectric layer, and electrically isolated from the first and the second electrode regions and the semiconductive sidewall spacer.

9. The device of claim 8, wherein the semiconductive sidewall spacer comprises a material selected from the group consisting of polysilicon, amorphous silicon and monocrystalline silicon.

10. The device of claim 8 further comprising:
a third dielectric layer overlying the substrate and underlying the first electrode region.

11. A semiconductor device comprising:
a substrate;
a first electrode region overlying the substrate, the first electrode region lying within a first plane;
a second electrode region overlying the substrate and electrically isolated from the first electrode region, the second electrode region lying within the first plane;
a first dielectric layer overlying the first and the second electrode regions;
an opening in the first dielectric layer wherein the opening intersects a portion of the first electrode region and a portion of the second electrode region, the opening having a perimeter and a sidewall;
a semiconductive sidewall spacer adjacent to the sidewall of the opening, and formed around the perimeter of the opening, the semiconductive sidewall spacer being electrically coupled to the first and the second electrode regions;
a second dielectric layer adjacent to the semiconductive sidewall spacer;
a control electrode adjacent to the second dielectric layer, and electrically isolated from the first and the second electrode regions and the semiconductive sidewall spacer.

12. The device of claim 11, wherein the semiconductive sidewall spacer comprises a material selected from the group consisting of polysilicon, amorphous silicon and monocrystalline silicon.

13. The device of claim 11 further comprising:
a third dielectric layer overlying the substrate and underlying the first electrode region.

14. A semiconductor device comprising:
a substrate;
a first dielectric layer overlying the substrate;
a first electrode region overlying the first dielectric layer, the first electrode region lying within a first plane and having a sidewall;
a second electrode region overlying the first dielectric layer and electrically isolated from the first electrode region, the second electrode region lying within the first plane and having a sidewall;
an opening in the first dielectric layer wherein the opening intersects a portion of the first electrode region and a portion of the second electrode region to define the respective sidewalls thereof, the opening having a perimeter;
a semiconductive sidewall spacer formed around the perimeter of the opening, the semiconductive sidewall spacer being electrically coupled to the sidewall of the first electrode region and the sidewall of the second electrode region;
a second dielectric layer adjacent to the semiconductive sidewall spacer;
a control electrode adjacent to the second dielectric layer, and electrically isolated from the first and the second electrode regions and the semiconductive sidewall spacer.

15. The device of claim 14, wherein the semiconductive sidewall spacer comprises a material selected from the group consisting of polysilicon, amorphous silicon and monocrystalline silicon.

16. A semiconductor device comprising:
- a semiconductive sidewall spacer having a channel region formed therein, the semiconductive sidewall spacer being further characterized as an annular region;
- a first electrode region self-aligned to the channel region;
- a second electrode region self-aligned to the channel region;
- a dielectric layer adjacent to the semiconductive sidewall spacer; and
- a control electrode adjacent to the dielectric layer wherein the control electrode is electrically isolated from the first and the second electrode regions and the semiconductive sidewall spacer.

17. The device of claim 16, further comprising a substrate selected from the group consisting of quartz, glass and silicon.

18. The device of claim 16, further comprising:
- a transistor having a gate wherein said control electrode and said gate are of continuous polysilicon.

19. The device of claim 16, wherein the semiconductive sidewall spacer comprises a material selected from the group consisting of polysilicon, amorphous silicon, and monocrystalline silicon.

20. The device of claim 16, wherein the dielectric layer is further characterized as being adjacent to the channel region.

21. A semiconductor device comprising:
- a semiconductive sidewall spacer having a channel region formed therein, the semiconductive sidewall spacer being further characterized as an annular region;
- a first electrode region self-aligned to the channel region;
- a second electrode region self-aligned to the channel region;
- a dielectric layer adjacent to the semiconductive sidewall spacer;
- a control electrode adjacent to the dielectric layer wherein the control electrode is electrically isolated from the first and the second electrode regions and the semiconductive sidewall spacer; and
- a transistor having a gate, wherein said control electrode and said gate are of continuous polysilicon.

22. The device of claim 21 wherein the semiconductive sidewall spacer comprises a material selected from the group consisting of polysilicon, amorphous silicon, and monocrystalline silicon.

23. The device of claim 21, wherein the dielectric layer is further characterized as being adjacent to the channel region.

* * * * *